(12) United States Patent
Janes et al.

(10) Patent No.: US 8,897,009 B2
(45) Date of Patent: *Nov. 25, 2014

(54) AIR COOLING OF MEDIUM VOLTAGE DRIVE COMPONENTS

(75) Inventors: Peter Janes, Cambridge (CA); Eric J. Hartsell, Woodstock (CA); Gabriel Gheorghe Cioara, Kitchener (CA)

(73) Assignee: Rockwell Automation Technologies, Inc., Mayfield Heights, OH (US)

(*) Notice: Subject to any disclaimer, the term of this patent is extended or adjusted under 35 U.S.C. 154(b) by 220 days.

This patent is subject to a terminal disclaimer.

(21) Appl. No.: 13/311,111

(22) Filed: Dec. 5, 2011

(65) Prior Publication Data

US 2012/0077428 A1   Mar. 29, 2012

Related U.S. Application Data

(63) Continuation of application No. 12/789,912, filed on May 28, 2010, now Pat. No. 8,072,756.

(51) Int. Cl.
*H05K 7/20* (2006.01)
*F04D 29/48* (2006.01)
*H05K 5/00* (2006.01)

(52) U.S. Cl.
CPC ........ *H05K 7/20909* (2013.01); *H05K 7/20136* (2013.01)
USPC ......... 361/695; 415/121.3; 415/126; 454/184

(58) Field of Classification Search
None
See application file for complete search history.

(56) References Cited

U.S. PATENT DOCUMENTS

| | | | |
|---|---|---|---|
| 3,254,830 A | | 6/1966 | Wallin |
| 4,648,007 A | * | 3/1987 | Garner .......................... 361/695 |
| 5,892,195 A | * | 4/1999 | Aufermann et al. .......... 218/157 |
| 6,005,770 A | | 12/1999 | Schmitt |
| 6,011,689 A | | 1/2000 | Wrycraft |
| 6,042,474 A | | 3/2000 | Harvey et al. |
| 6,070,317 A | | 6/2000 | Allen et al. |
| 6,181,557 B1 | | 1/2001 | Gatti |
| 6,330,155 B1 | * | 12/2001 | Remsburg ..................... 361/695 |

(Continued)

OTHER PUBLICATIONS

Document titled "Centrifugal fans with asynchronous external rotor motor", Ziehl-Abegg, p. 307.

(Continued)

*Primary Examiner* — Gregory Thompson
(74) *Attorney, Agent, or Firm* — Fay Sharpe LLP (57) ABSTRACT

A parallel redundant fan system includes at least first and second fans located adjacent each other. Each fan includes: (i) a fan housing defining a fan chamber in which an impeller is supported for rotation about an axis of rotation; (ii) a first chamber outlet in communication with the fan chamber and defined by an opening in a first wall of the fan housing; (iii) a second chamber outlet in communication with the fan chamber and defined by an opening in a second wall of the fan housing; and, (iii) first and second backflow prevention dampers respectively associated with the first and second chamber outlets. The first and second dampers respectively include first and second damper plates that selectively pivot from their closed positions toward their opened positions against the closing force of respective first and second counterweights in response to exhaust air flow pressure exerted thereon.

20 Claims, 9 Drawing Sheets

(56) References Cited

U.S. PATENT DOCUMENTS

| | | |
|---|---|---|
| 6,475,078 B1 | 11/2002 | Borcherding |
| 6,710,240 B1 | 3/2004 | Chen et al. |
| 6,822,866 B2 | 11/2004 | Fearing et al. |
| 6,936,767 B2 | 8/2005 | Kleinecke et al. |
| 7,088,583 B2 | 8/2006 | Brandon et al. |
| 7,329,089 B2 | 2/2008 | Senba |
| 7,379,299 B2 | 5/2008 | Walsh et al. |
| 7,416,481 B2 | 8/2008 | Baker et al. |
| 7,529,088 B2 | 5/2009 | Chiu et al. |
| 7,952,870 B1 | 5/2011 | Zhou |
| 2002/0089056 A1 | 7/2002 | Eady et al. |
| 2005/0077065 A1 | 4/2005 | Kleinecke et al. |
| 2005/0252672 A1 | 11/2005 | Kleinecke et al. |
| 2008/0192429 A1 | 8/2008 | Woolsey et al. |
| 2008/0233861 A1 | 9/2008 | Jenkins et al. |
| 2009/0065182 A1 | 3/2009 | Takahashi et al. |
| 2009/0215380 A1 | 8/2009 | Lin |

OTHER PUBLICATIONS

European Search Report dated Nov. 5, 2012 for European Application No. EP 11 16 7827.

\* cited by examiner

AIR COOLING OF MEDIUM VOLTAGE DRIVE COMPONENTS

CROSS-REFERENCE TO RELATED APPLICATION

This application is a continuation of U.S. application Ser. No. 12/789,912 filed May 28, 2010, the entire disclosure of which is hereby expressly incorporated by reference into the present specification.

BACKGROUND

Motor drives are power conversion systems or "converters" that operate to provide power to electric motors in a controlled fashion to control one or more motor performance parameters, such as speed, torque, etc. Medium voltage current-source type motor drives typically receive multiphase AC input power in the voltage range of about 2,400 to 6,900 volts, which is converted in a rectifier to DC power supplied to a DC link and provided from the DC link to an inverter. The inverter switches the DC link currents to provide AC output current to a motor load with the output current being controlled by the inverter in closed loop fashion to drive the motor at a desired speed and/or torque. The rectifier is generally an active switching type rectifier that selectively activates switches to provide current from the AC input to the DC link bus to achieve AC to DC power conversion, where the rectifier gain is controlled to provide a DC link current level at the peak current level required by the motor at any given time. The inverter, in turn, implements a switching scheme to selectively connect the motor leads to the DC link bus terminals to provide motor phase currents with controlled amplitudes, phase, and frequency to implement a particular motor control strategy based on motor performance feedback values and desired performance setpoints or profiles. Voltage source drives are similar but the DC link supplies a select constant DC voltage instead of a select constant DC current.

These motor drives generate large amounts of heat that must be exhausted from the various component housings/enclosures, e.g., from the common mode choke (CMC) housings/enclosures. This has previously been accomplished with redundant exhaust fan systems with two or more vertically stacked fans in which failure of one of the fans results in operation a redundant fan. These stacked fan systems are not suitable for use in applications where vertical space/height is limited. Also, the vertically stacked fans have been found to be suboptimal for other reasons such as noise, efficiency, and other reasons.

SUMMARY

In accordance with a first aspect of the present development, an electrical equipment enclosure includes an enclosure housing and a parallel redundant fan system including at least first and second fans supported on the enclosure housing. The first and second fans are located adjacent each other and each include: (i) a fan housing defining a fan chamber in which an impeller is supported for rotation about an axis of rotation; (ii) a first chamber outlet in communication with the fan chamber and defined by an opening in a first wall of the fan housing; (iii) a second chamber outlet in communication with the fan chamber and defined by an opening in a second wall of the fan housing; and, (iii) first and second backflow prevention dampers respectively associated with the first and second chamber outlets. The first backflow prevention damper includes: (i) a first damper plate located outside the fan chamber and pivotally connected to the first wall of the fan housing, the first damper plate pivotable about a first pivot axis between a closed position where it is positioned in covering relation with the first chamber outlet and an opened position where it is pivoted away from the first chamber outlet to allow exhaust air flow through the first chamber outlet from the fan chamber; and (ii) a first counterweight connected to the first damper plate that exerts a closing force on the first damper plate that urges the first damper plate toward its closed position. The second backflow prevention damper includes: (i) a second damper plate located outside the fan chamber and pivotally connected to the second wall of the fan housing, the second damper plate pivotable about a second pivot axis between a closed position where it is positioned in covering relation with the second chamber outlet and an opened position where it is pivoted away from the second chamber outlet to allow exhaust air flow through the second chamber outlet from the fan chamber; and (ii) a second counterweight connected to the second damper plate that exerts a closing force on the second damper plate that urges the second damper plate toward its closed position. The first and second damper plates selectively pivot from their closed positions toward their opened positions against the closing force of the first and second counterweights, respectively, in response to exhaust air flow pressure exerted on the first and second damper plates by exhaust air flowing from the fan chamber through the first and second chamber outlets.

In accordance with another aspect of the present development, a parallel redundant fan system includes at least first and second fans located adjacent each other. Each fan includes: (i) a fan housing defining a fan chamber in which an impeller is supported for rotation about an axis of rotation; (ii) a first chamber outlet in communication with the fan chamber and defined by an opening in a first wall of the fan housing; (iii) a second chamber outlet in communication with the fan chamber and defined by an opening in a second wall of the fan housing; and, (iii) first and second backflow prevention dampers respectively associated with the first and second chamber outlets. The first backflow prevention damper includes: (i) a first damper plate located outside the fan chamber and pivotally connected to the first wall of the fan housing, the first damper plate pivotable about a first pivot axis between a closed position where it is positioned in covering relation with the first chamber outlet and an opened position where it is pivoted away from the first chamber outlet to allow exhaust air flow through the first chamber outlet from the fan chamber; and (ii) a first counterweight connected to the first damper plate that exerts a closing force on the first damper plate that urges the first damper plate toward its closed position. The second backflow prevention damper includes: (i) a second damper plate located outside the fan chamber and pivotally connected to the second wall of the fan housing, the second damper plate pivotable about a second pivot axis between a closed position where it is positioned in covering relation with the second chamber outlet and an opened position where it is pivoted away from the second chamber outlet to allow exhaust air flow through the second chamber outlet from the fan chamber; and (ii) a second counterweight connected to the second damper plate that exerts a closing force on the second damper plate that urges the second damper plate toward its closed position. The first and second damper plates selectively pivot from their closed positions toward their opened positions against the closing force of the first and second counterweights, respectively, in response to exhaust air flow pressure exerted on the first and second damper plates by exhaust air flowing from the fan chamber through the first and second chamber outlets.

DETAILED DESCRIPTION

Figure 1:
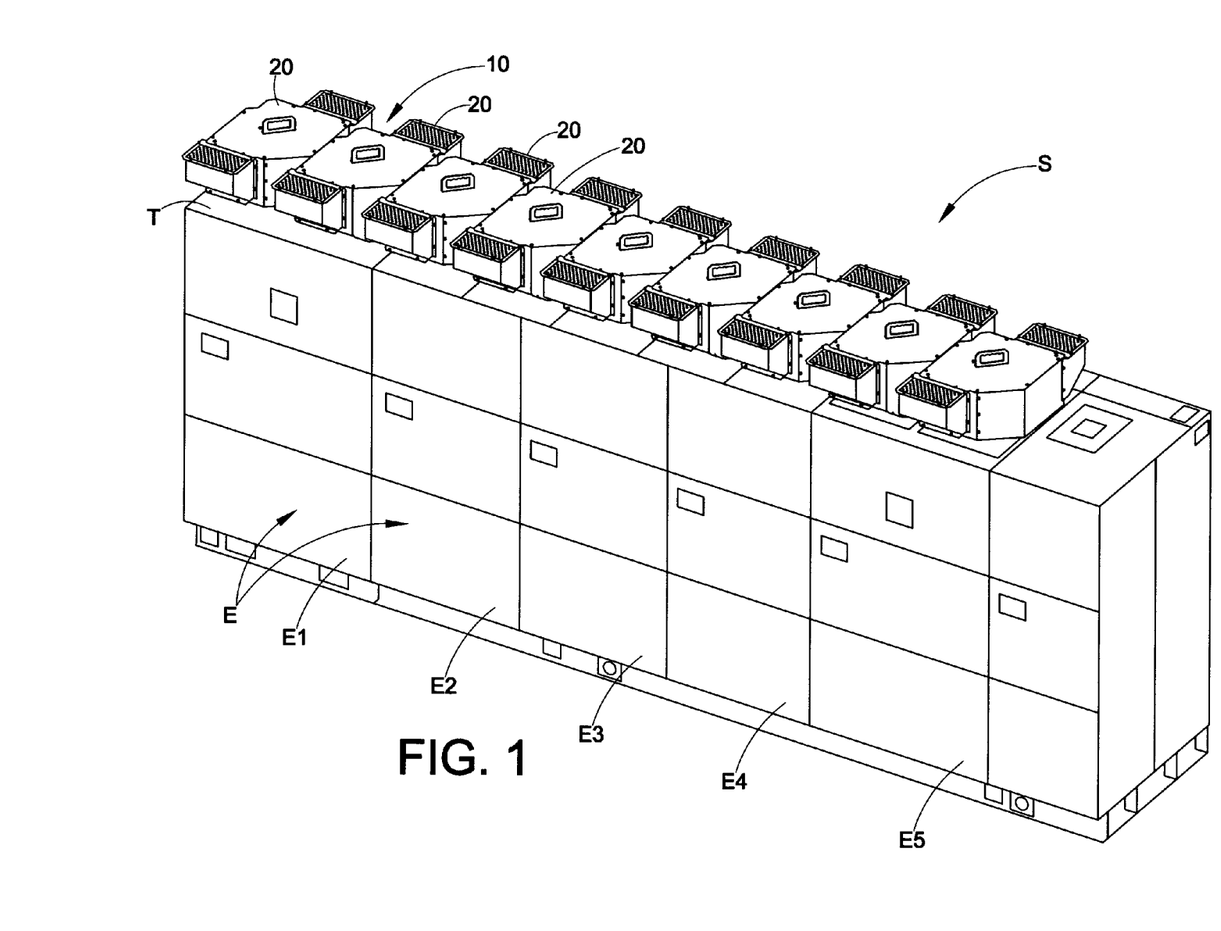
FIG. 1 is an isometric view of a drive or converter system including a plurality of individual cabinets which enclose common mode choke (CMC) magnetics, power semiconductors, capacitors, line reactors, and various other electrical components and a parallel redundant exhaust fan system formed in accordance with the present development.

FIG. 1 is an isometric view of a motor drive or converter system S, such as a medium voltage current-source type motor drive that receives multiphase AC input power in the range of about 2,400 to 6,900 volts and uses a rectifier to convert same to DC power supplied to a DC link and provided from the DC link to an inverter. The inverter switches the DC link currents to provide AC output current to a motor load with the output current being controlled by the inverter in closed loop fashion to drive the motor at a desired speed and/or torque. The system S includes one or more housings or enclosures E (E1,E2,E3,E4,E5) from which heat must be exhausted. According to the present development, the system S includes a parallel redundant exhaust fan system 10 formed in accordance with the present development for circulating cooling air through the enclosure E and for exhausting the resulting heated air from the enclosure E. The system S is shown with a parallel redundant exhaust fan system comprising nine fans 20, but only a minimum of two adjacent fans 20 are required to define the parallel redundant exhaust fan system, and the system 10 is described below using only two fans 20.

Figure 2:
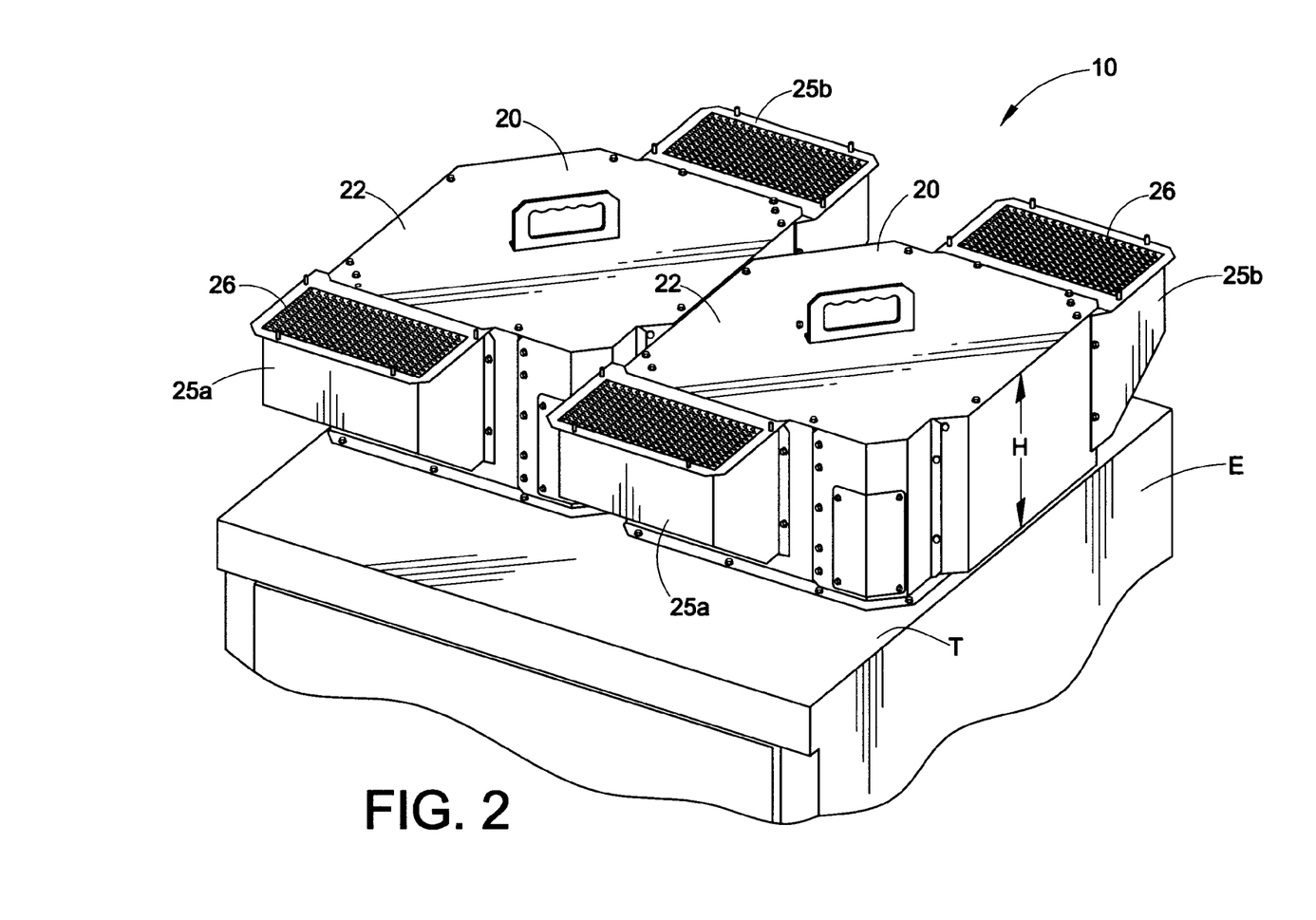
FIG. 2 is a partial enlarged isometric view of one of the CMC enclosures of FIG. 1, showing a two fan parallel redundant exhaust fan system including first and second exhaust fans each formed in accordance with the present development.

Referring now to FIG. 2, each parallel redundant exhaust fan system 10 includes at least first and second blowers/fans 20, each of which is constructed and operated in accordance with the present development to draw air into, circulate air through, and exhaust air from an enclosure E with which the first and second fans 20 are in fluid communication. The first and second fans 20 of each parallel redundant fan system 10 are installed laterally or horizontally adjacent each other in a side-by-side manner at the same height on a top panel T of the enclosure E. The first and second adjacent fans 20 operate alternately, meaning that one fan 20 is active while the second fan is inactive or vice versa, depending upon the state of the temperature management control system of the converter system S, and the inactive fan 20 is activated automatically by the temperature management control system in case the adjacent active fan 20 (or another active fan 20 of the system 10) fails. The parallel adjacent arrangement of the fans 20 reduces a vertical space requirement of the enclosure E as compared to use of vertically stacked fans by minimizing the distance H that the fans extend above the enclosure top panel T which allows the converter system S to be installed in buildings and other applications where overall vertical space is limited by the roof, duct work, pipes, and/or other obstructions.

Figure 3:
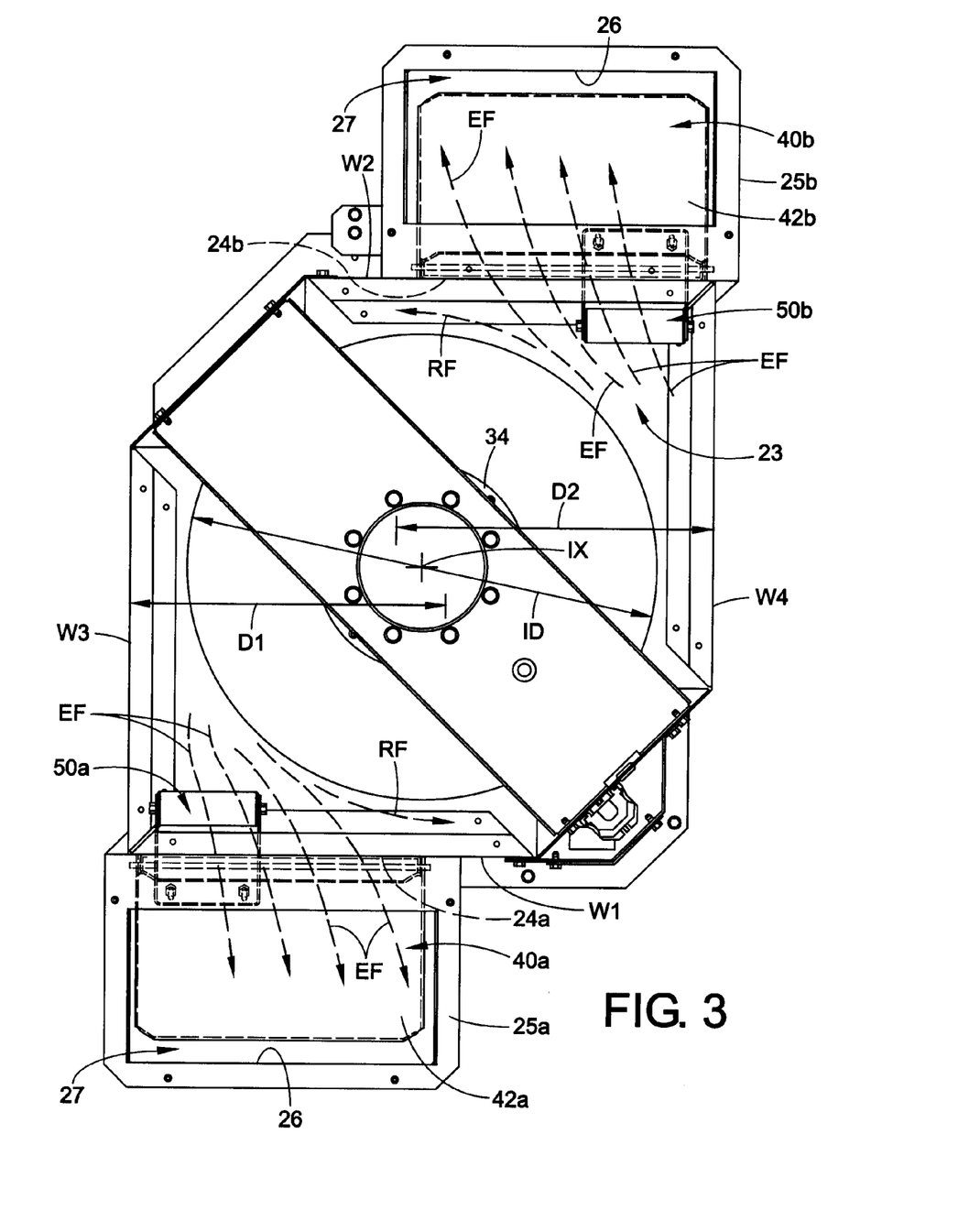
FIG. 3 is a top view of an exhaust fan formed in accordance with the present development, with portions removed, showing the exhaust air flow.
Figure 5A:
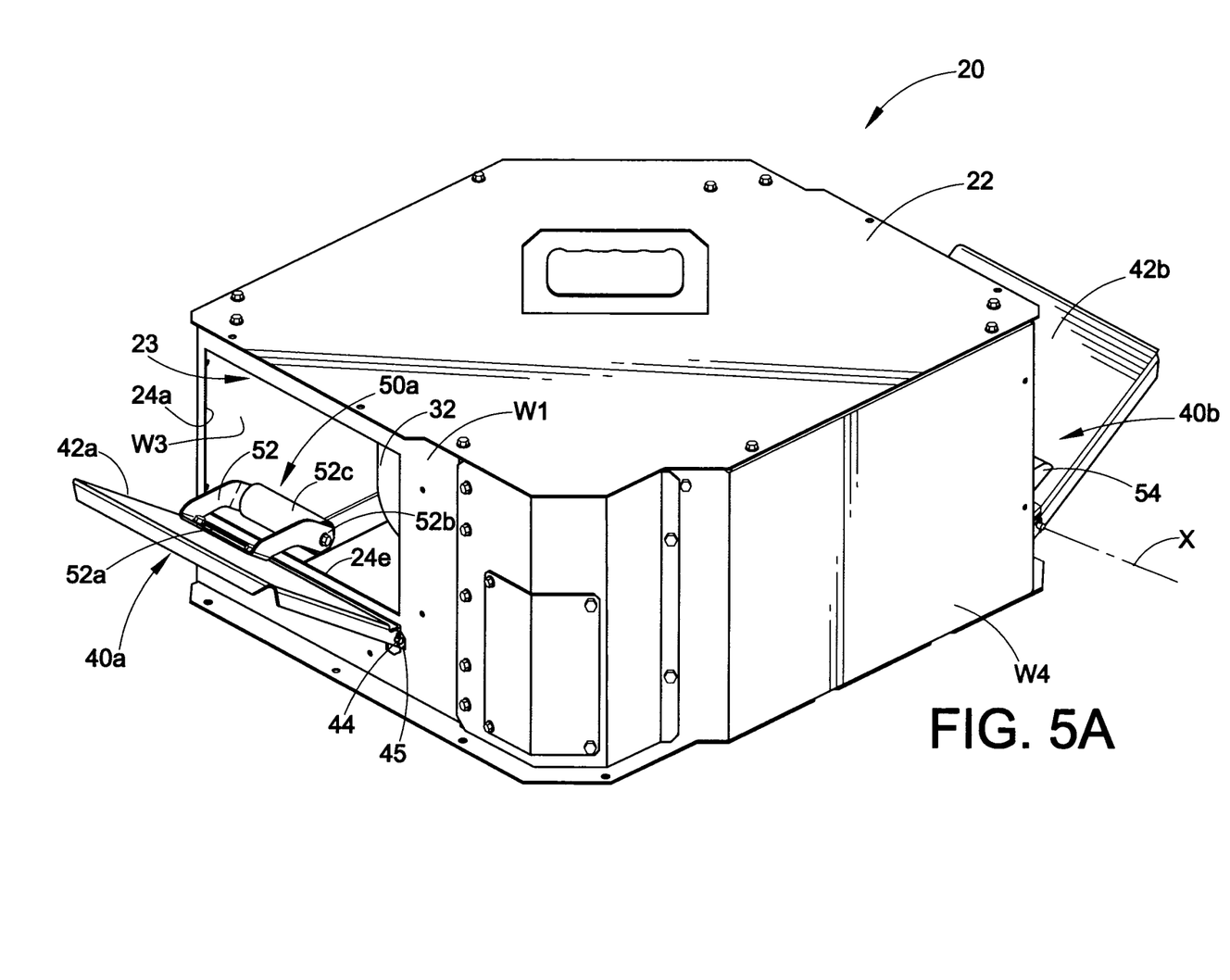
FIGS. 5A and 5B are respective front and rear isometric views of an exhaust fan formed in accordance with the present development, with both exhaust outlet air deflectors removed and with both backflow prevention dampers in their opened positions.
Figure 5B:
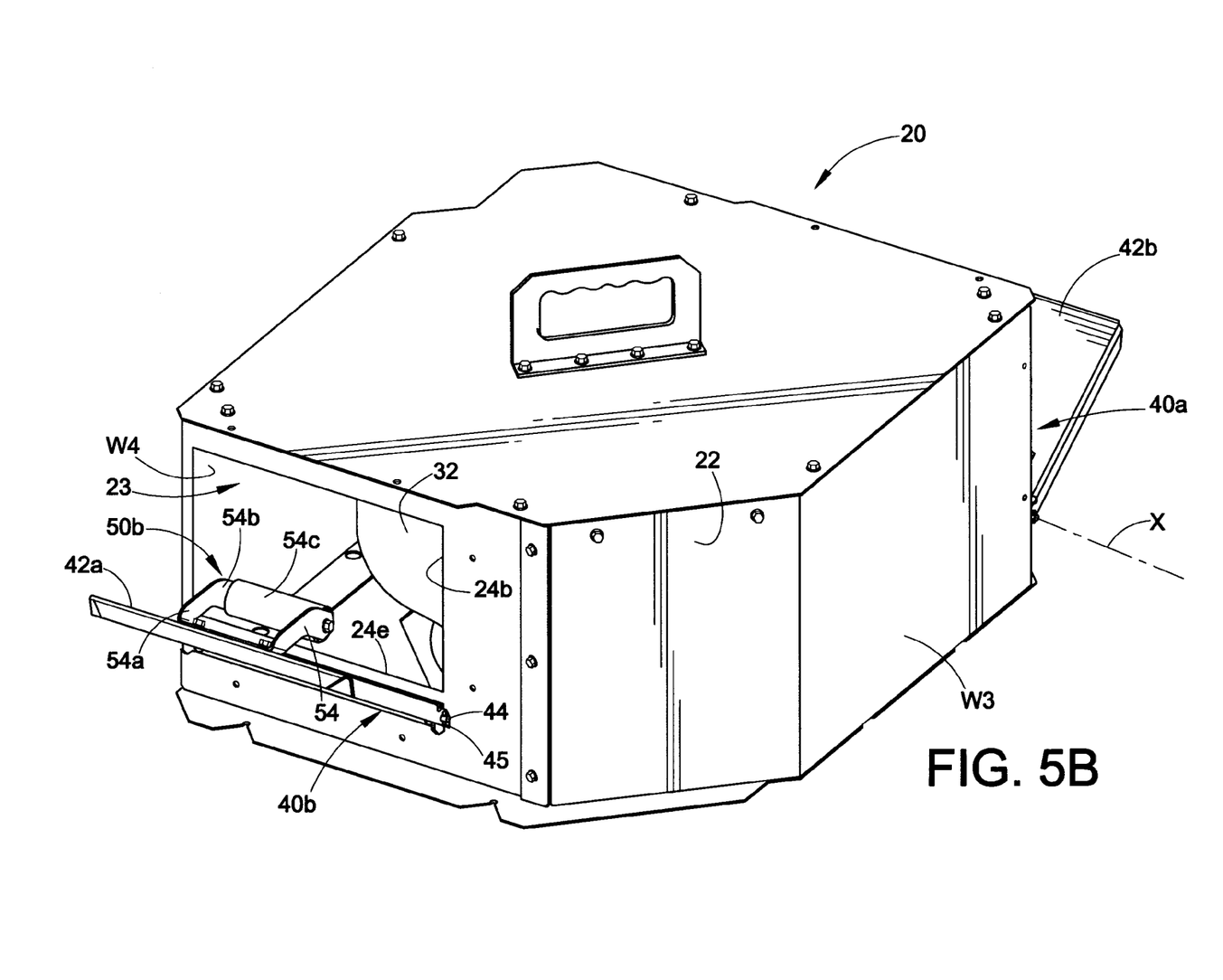

Referring also to FIG. 3, each fan 20 includes a housing 22 that defines a hollow internal fan chamber 23 that contains an impeller system 30 comprising an impeller 32 and a motor drive system such as an electric motor 34 that selectively rotates the impeller 32 about a vertical axis IX of rotation to draw air into and through the enclosure E and then into the fan chamber 23, where the air is exhausted through first and second exhaust outlet openings or chamber outlets 24a,24b of the chamber 23 (see also FIGS. 5A and 5B). The fan housing 22 further includes first and second exhaust air deflectors 25a,25b arranged in covering relation with the first and second chamber outlets 24a,24b, respectively, for receiving exhaust air flow from the chamber outlets 24a,24b and for directing the exhaust air flow from a radial horizontal path as it exits the chamber outlets 24a,24b to a upward vertical path at a deflector outlet 26, which opens to the external or ambient environment outside the fan housing 22. Each deflector outlet 26 is covered by a fine screen or mesh to prevent debris from entering the air deflector 25a,25b.

With continuing reference to FIGS. 3, 5A, and 5B, the first and second chamber outlets 24a,24b have the same configuration (size/shape) and are located on opposite first and second sides of the impeller 32 at diametrically opposed locations. The first outlet 24a is defined by an opening in a first (front) wall W1 of the housing 22, and the second outlet 24b is defined by an opening in a second (rear) wall W2 of the housing 22. The front and rear housing walls W1,W2 are vertically oriented and are parallel to each other. The housing 22 includes parallel third and fourth walls W3,W4 arranged perpendicular or otherwise transverse to the first and second walls W1,W2. The first outlet 24a extends laterally across the first wall W1 from a starting location adjacent the third wall W3 a distance D1 from the third wall W3 that is at least 57% of the diameter ID of the impeller 32. The first outlet 24a also extends from its starting location adjacent the third wall to a location located beyond the axis of rotation IX or centerline of the impeller 32. The second outlet 24b extends laterally across the second wall W2 from a starting location adjacent the fourth wall W4 a distance D2 from the fourth wall W4 that is at least 57% of the diameter ID of the impeller 32. The second outlet 24b also extends from its starting location adjacent the fourth wall W4 to a location located beyond the axis of rotation IX or centerline of the impeller 32. As shown in FIG. 3, this arrangement has been found to maximize exhaust airflow through the chamber outlets 24a,24b (indicated by arrows EF) and to minimize recirculation airflow between the impeller 32 and the first and second walls W1,W2 (indicated by arrows RF). The fourth wall W4 of the first fan 20 abuts or is otherwise located adjacent the third wall W3 of the second fan 20 in the parallel redundant fan system 10.

When one of the fans 20 is active and the other is inactive and available as a redundant backup as described above, it is highly undesirable and inefficient to allow recirculatory exhaust airflow from the active fan 20 to be drawn into the inactive fan housing 22 through the air deflectors 25a,25b and chamber outlets 24a,24b and into the fan chamber 23 of the inactive fan 22. The upward vertical orientation of the deflector outlets 26 helps to discourage this undesired recirculating exhaust airflow. However, the negative air pressure inside the enclosure E due to operation of the active fan 20 will tend to draw the exhaust airflow from the outlets 26 of the active fan air deflectors 25a,25b into the fan chamber 23 of the inactive fan 20 through its air deflectors 25a,25b and into the enclosure E.

Figure 4:
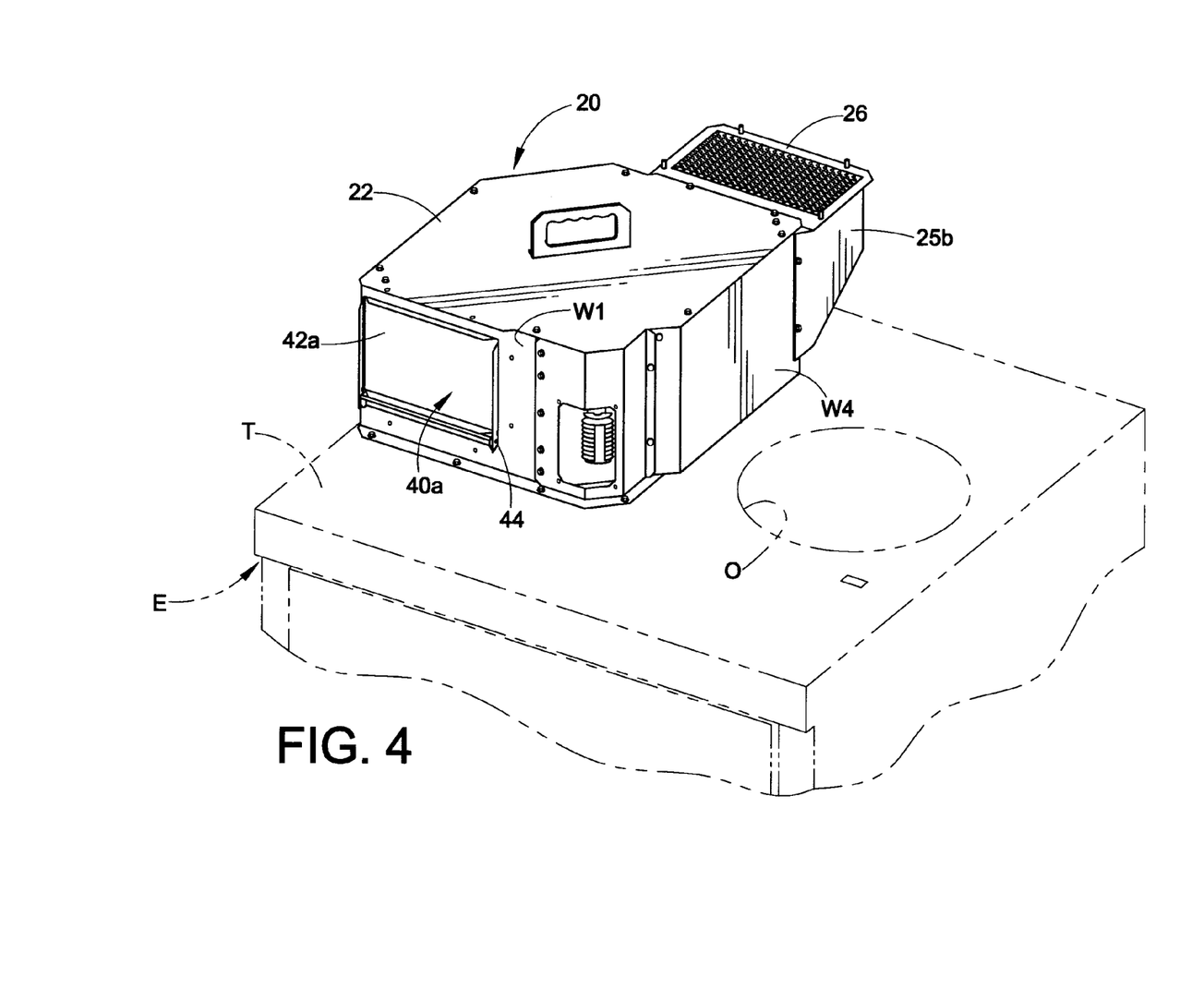
FIG. 4 is an isometric view of one of the exhaust fans of FIG. 2, with an exhaust outlet air deflector removed to reveal a backflow prevention damper provided in accordance with the present development (with the damper in its closed position)

To prevent this undesired recirculating exhaust airflow, each fan housing 22 includes first and second backflow prevention dampers 40a,40b (FIGS. 4, 5A, 5B) respectively associated with and located respectively adjacent its first and second chamber outlets 24a,24b and respectively adapted to selectively open and close the first and second chamber outlets 24a,24b. FIG. 4 is an isometric view of one of the exhaust fans 20 with the first exhaust outlet air deflector 25a removed to reveal the first backflow prevention damper 40a (with the damper 40a in its closed position). FIGS. 5A and 5B are respective front and rear isometric views of an exhaust fan 20 formed in accordance with the present development, with both the first and second exhaust outlet air deflectors 26a,26b removed and with both the first and second backflow prevention dampers 40a,40b in their opened positions. It can be seen in these views that the first and second dampers 40a,40b comprises respective first and second damper plates 42a,42b conformed and dimensioned to cover the respective first and second chamber outlets 24a,24b. The first and second damper plates 42a,42b are respectively pivotally connected to the first and second walls W1,W2 of the fan housing 22. In particular, the dampers 40a,40b include respective hinges 44 that pivotally connect the first and second damper plates 42 to the first and second walls W1,W2, respectively. The hinges 44 define horizontal pivot axes X located vertically below a lower edge 24e of the first and second chamber outlets 24a,24b.

The first and second damper plates 42a,42b are freely pivotable about their respective horizontal pivot axes X, without spring biasing, between a closed position (FIG. 4) where the first and second damper plates 42a,42b are positioned in covering relation with the first and second chamber outlets 24a,24b, respectively, and an opened position where the first and second damper plates 42a,42b are pivoted away from their respectively associated first and second chamber outlets 24a,24b in order to open the first and second chamber outlets 24a,24b (FIGS. 5A and 5B). In their closed positions, the first and second damper plates 42a,42b block recirculating air flow into the fan chamber 23 through the respective first and second chamber outlets 24a,24b. In their opened positions, the first and second damper plates 42a,42b allows exhaust air flow out of the fan chamber 23 through the respective first and second chamber outlets 24a,24b and the first and second deflectors 25a,25b.

The first damper plate 42a includes at least one stop portion 45 that abuts the first wall W1 or other part of the fan housing 22 when the first damper plate 42a is located in its opened position to prevent further pivoting movement of the first damper plate 42a away from is closed position beyond its opened position. Likewise, the second damper plate 42b also includes at least one stop portion 45 that abuts the second wall W2 or other part of the fan housing 22 when the second damper plate 42b is located in its opened position to prevent further pivoting movement of the second damper plate 42b away from is closed position beyond its opened position.

The first and second dampers 40a,40b further comprise first and second counterweights 50a,50b connected to the first and second damper plates 42, respectively. The first and second counterweights 50a,50b exert respective first and second closing forces on the first and second damper plates 42a,42b. The first and second closing forces urge the first and second damper plates 42a,42b toward their closed positions. The first and second counterweights 50a,50b respectively hold the first and second damper plates 42a,42b in their closed positions until the fan 20 is activated and the impeller 32 induces sufficient exhaust air pressure on the first and second damper plates 42a,42b at the first and second chamber outlets 24a, 24b to pivot the first and second damper plates 42a,42b from their closed positions (FIG. 4) to their opened positions (FIG. 5A and FIG. 5B) by force of the exhaust air flow from the impeller 32.

The first counterweight 50a comprises a first bracket 52 having a first end 52a connected to an inner face of the first damper plate 42a by fasteners or other means such as welding and a second end 52b spaced from the first end 52a and located inside the fan chamber 23. A first weight or ballast 52c is connected to the second end 52b of the first bracket 52, e.g., between spaced-apart arms of the first bracket as shown. The first bracket 52 extends from its first end 52a located adjacent the first damper plate 42a, through the first chamber outlet 24a to the second end 52b that is located inside the fan chamber 23 and to which the first ballast 52c is connected. When the first damper plate 42a is in its closed position, the first end 52a is located at a vertical level that is above the second end 52b and first ballast 52c. Also, the first ballast 52c is located at a vertical level below the horizontal pivot axis X of the first damper plate 42a when the first damper plate 42a is in its closed position.

The second counterweight 50b has the same structure as the first counterweight 50a and thus comprises a second bracket 54 having a first end 54a connected to an inner face of the second damper plate 42b by fasteners or welding or the like and a second end 54b spaced from the first end 54a and located inside the fan chamber 23. A second weight or ballast 54c is connected to the second end 54b of the first bracket 54, e.g., between spaced-apart arms of the second bracket as shown. The second bracket 54 extends from its first end 54a located adjacent the second damper plate 42b, through the second chamber outlet 24b to the second end 54b that is located inside the fan chamber 23 and to which the second ballast 54c is connected. When the second damper plate 42b is in its closed position, the first end 54a is located at a vertical level above the second end 54b and second ballast 54c. The second ballast 54c is located at a vertical level below the horizontal pivot axis X of the second damper plate 42b when the second damper plate is in its closed position.

Figure 6:
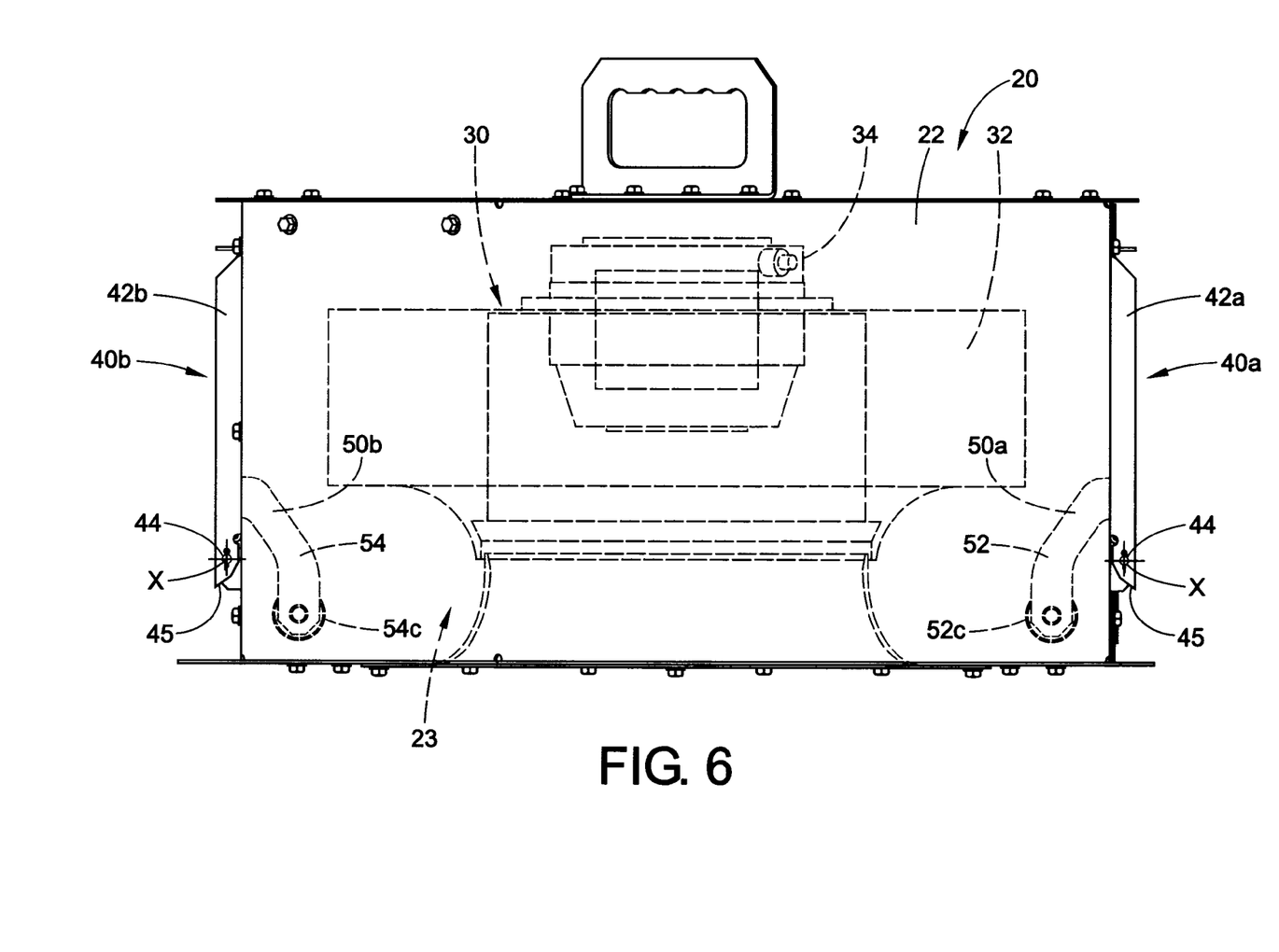
FIG. 6 is a side view of the exhaust fan of FIG. 4 (with both exhaust air deflectors removed) and showing the backflow prevention dampers in their closed positions.
Figure 7:
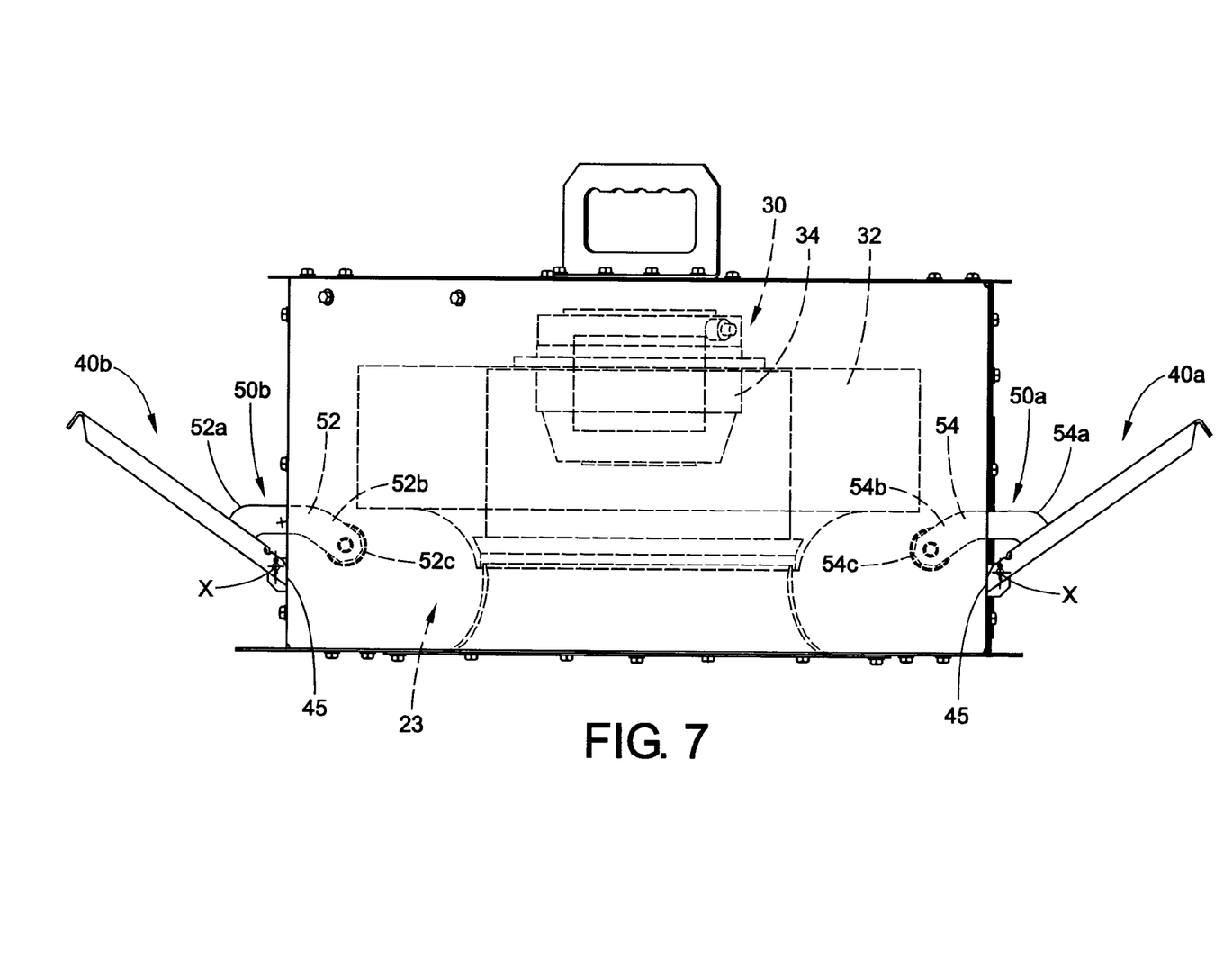
FIG. 7 is a side view of the exhaust fan similar to FIG. 6, but showing both backflow prevention dampers in their opened positions.

As shown in FIGS. 6 and 7, the above-described configuration of the first and second counterweights 50a,50b, including the shape of the first and second brackets 52,54 and location of the first and second ballast 52c,54c, ensures that the first and second counterweights 50a,50b do not contact the impeller 32 when the dampers 40a,40b move between their closed positions (FIG. 6) and their opened positions (FIG. 7), and also ensures that the first and second counterweights 50a,50b have a minimal effect on exhaust air flow from the fan chamber 23 through the first and second chamber outlets 24a,24b into the first and second deflectors 25a,25b (the deflectors are not shown in FIGS. 6 and 7). FIGS. 6 and 7 also show that the fan housing 22 includes an inlet I in fluid communication with the fan chamber 23 and that communicates with the interior of the enclosure E through an enclosure opening O (FIG. 4).

Figure 8:
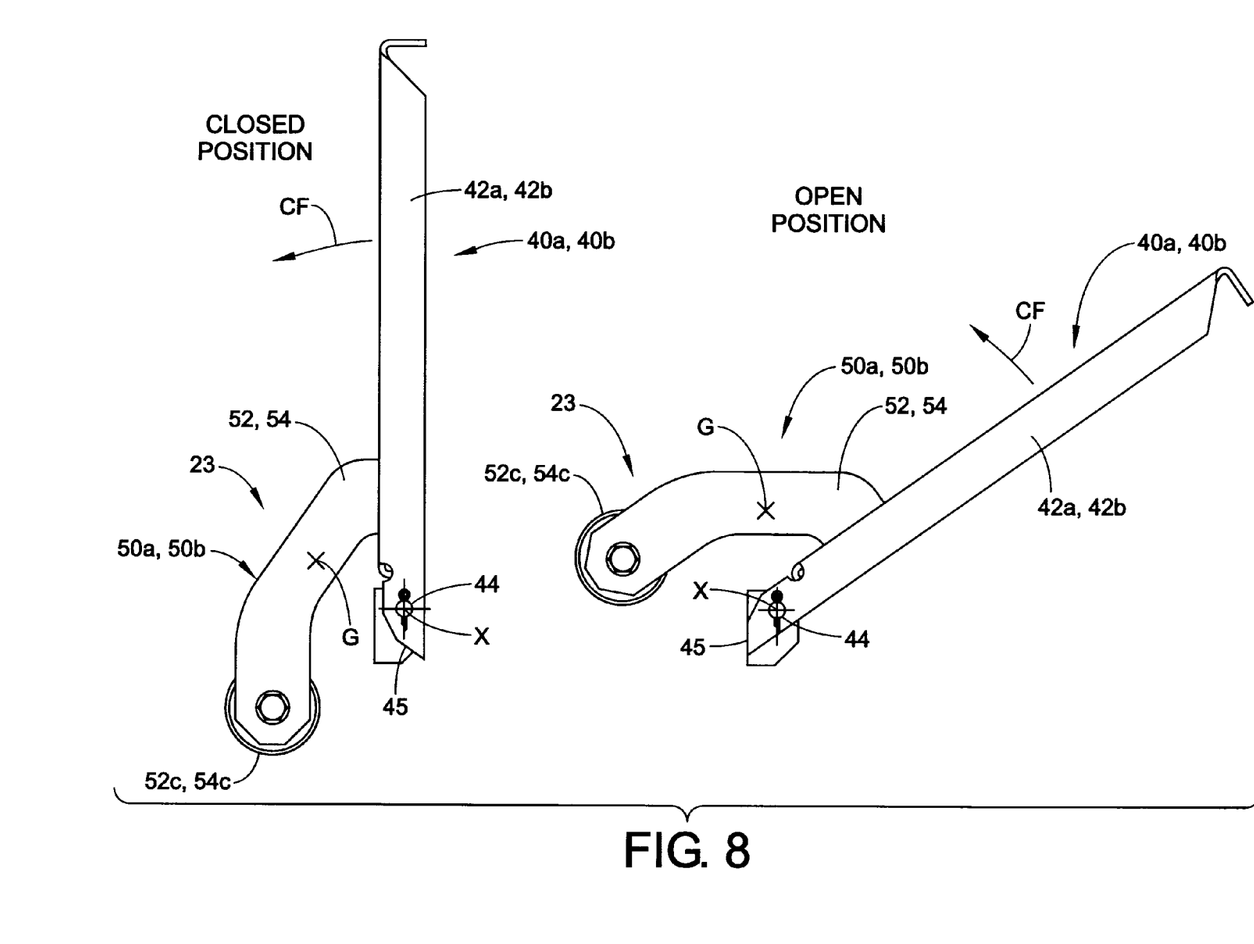
FIG. 8 is a diagram that illustrates the structure and operation of a backflow prevention damper formed in accordance with the present development.

Referring to FIG. 8, it can be seen that each damper 40a, 40b of the illustrated embodiment defines a center of gravity G that is located vertically above its center of rotation as defined by its horizontal pivot axis X. For all positions of the damper plates 42a,42b, the center of gravity G is located on only the inner side of a vertical plane including the pivot axis X, wherein the inner side of the vertical plane is the side oriented toward the inside of the fan chamber 23, i.e., the center of gravity G is located inside the cooking chamber 23 or just outside the cooking chamber between the wall W1,W2 and the vertical plane including the pivot axis X, but the center of gravity never passes through the vertical plane in which the pivot axis X is contained, even when the dampers 40a,40b are moved completely to their opened positions. This geometry ensures that the first and second counterweights 50a,50b will always establish the above-noted closing force (indicated by the arrow CF) that is required to urge the first and second damper plates 42a,42b toward their closed positions. In alternative embodiments, the centers of gravity G of the respective dampers 40a,40b can be located below their respective pivot axes X, e.g., to accommodate space constraints, to purposefully direct airflow to preferred locations, to control response time of damper movements, and/or to control volume of air flow and the like.

The first and second exhaust air deflectors 26a,26b are conformed and dimensioned to accommodate movement of the first and second damper plates 42a,42b between their opened and closed positions without interference. FIG. 3 shows that a space 27 exists between the periphery of the damper plates 42a,42b and the respective air deflectors 26a, 26b when the damper plates 42a,42b are located in their opened positions.

In use, the dampers 40a,40b of an inactive fan 20 will remain closed while the fan is inactive. Exhaust air flow from adjacent active fan(s) will not enter the fan chamber 23 of the inactive fan. The counterweights 50a,50b hold the dampers of the inactive fan 20 closed, and negative pressure in the enclosure E will also draw the damper plates 42a,42b inward toward their closed positions to ensure that the chamber outlets 24a,24b are closed. Upon the failure or other deactivation of an active fan, the inactive fan is activated such that exhaust air pressure in the chamber 23 will force the dampers 40a,40b to their opened positions such that the exhaust air flows out of the fan chamber 23 through the chamber outlets 24a,24b and into the deflectors 25a,25b where the exhaust air is directed vertically upward through the deflector outlets 26. If the fan is again deactivated, the closing force CF of the counterweights 50a,50b will move the dampers 40a,40b back to their closed positions.

Each fan/blower 20 is shown herein as a backward inclined motorized impeller. The dampers 40a,40b can alternatively be used with other types of motorized fans/blowers, and it is not intended that the present development be limited to the particular fan/blower example shown herein.

The development has been described with reference to preferred embodiments. Those of ordinary skill in the art will recognize that modifications and alterations to the preferred embodiments are possible. The disclosed preferred embodiments are not intended to limit the scope of the following claims, which are to be construed as broadly as possible, whether literally or according to the doctrine of equivalents.

The invention claimed is:

1. A fan system for an electrical equipment enclosure, said fan system comprising:
a housing defining a chamber;
a first outlet in communication with said chamber and defined by an opening in a first wall of said housing;
a first backflow prevention damper associated with said first outlet, said first backflow prevention damper comprising: (i) a first damper plate movable relative to said housing between a closed position where it is positioned in covering relation with said first outlet and an opened position where it is moved away from said first outlet to allow exhaust air flow through said first outlet from said chamber; and, (ii) a first counterweight connected to said first damper plate that exerts a closing force on said first damper plate that urges said first damper plate toward its closed position, wherein said first counterweight is connected to first damper plate at a location spaced from an inside face of said first damper plate that is oriented toward said chamber when said first damper plate is located in its closed position;
wherein said first damper plate selectively pivots about a first pivot axis from its closed position toward its opened position against the closing force of the first counterweight in response to exhaust air flow pressure exerted on the first damper plate by exhaust air flowing from said chamber through said first outlet;
said first counterweight comprising
a first ballast
connected to said first damper plate and located below said first pivot axis when said first damper plate is located in its closed position.

2. A fan system for an electrical equipment enclosure, said fan system comprising:
a housing defining a chamber;
a first outlet in communication with said chamber and defined by an opening in a first wall of said housing;
a first backflow prevention damper associated with said first outlet, said first backflow prevention damper comprising: (i) a first damper plate movable relative to said housing between a closed position where it is positioned in covering relation with said first outlet and an opened position where it is moved away from said first outlet to allow exhaust air flow through said first outlet from said chamber; and, (ii) a first counterweight connected to said first damper plate that exerts a closing force on said first damper plate that urges said first damper plate toward its closed position;
wherein said first damper plate selectively pivots about a first pivot axis from its closed position toward its opened position against the closing force of the first counterweight in response to exhaust air flow pressure exerted on the first damper plate by exhaust air flowing from said chamber through said first outlet; and
a first stop connected to said first damper plate, wherein said first stop abuts said housing and prevents pivoting movement of said first damper plate away from its closed position beyond its opened position when said first damper plate is located in its opened position.

3. The fan system as set forth in claim 2, wherein said first damper plate pivots relative to said housing between its opened and closed positions about a first pivot axis.

4. The fan system as set forth in claim 3, wherein said first pivot axis is oriented horizontal.

5. The fan system as set forth in claim 4, wherein said first backflow prevention damper comprises a center of gravity located vertically above said first pivot axis and on an inner side of a first vertical plane that includes said first pivot axis, said inner side of said first vertical plane being oriented toward said chamber.

6. The fan system as set forth in claim 5, wherein:
said first counterweight is connected to first damper plate at a location spaced from an inside face of said first damper plate that is oriented toward said chamber when said first damper plate is located in its closed position.

7. The fan system as set forth in claim 2, further comprising:
a first exhaust air deflector located adjacent the first outlet for directing exhaust air flow from a horizontal path as it exits the first outlet to a upward path.

8. The fan system as set forth in claim 2, further comprising:
a second outlet in communication with said chamber and defined by an opening in a second wall of said housing;
a second backflow prevention damper associated with said second outlet, said second backflow prevention damper comprising: (i) a second damper plate movable between a closed position where it is positioned in covering relation with said second outlet and an opened position where it is moved away from said second outlet to allow exhaust air flow through said second outlet from said chamber; and, (ii) a second counterweight connected to said second damper plate that exerts a closing force on said second damper plate that urges said second damper plate toward its closed position;
wherein said second damper plate selectively pivots from its closed position toward its opened position against the closing force of the second counterweight in response to exhaust air flow pressure exerted on the second damper plate by exhaust air flowing from said chamber through said second outlet.

9. The fan system as set forth in claim 8, further comprising:
a second exhaust air deflector located adjacent the second outlet for directing exhaust air flow from a horizontal path as it exits the second outlet to a upward path.

10. The fan system as set forth in claim 8, wherein:
said first and second walls of said housing in which said first and second outlets are respectively defined are both vertically oriented and are arranged parallel and in spaced-apart relative to each other such that said first and second outlets are located on opposite sides of said chamber.

11. The fan system as set forth in claim 10, further comprising an impeller supported for rotation in said chamber, wherein:
said housing further comprises third and fourth spaced-apart walls that are arranged transverse to said first and second walls;
said first outlet extends laterally across the first wall from a location adjacent the third wall a first distance from the third wall that is greater than a minimum distance between the third wall and the axis of rotation of the impeller;
said second outlet extends laterally across the second wall from a location adjacent the fourth wall a second distance that is greater than a minimum distance between the fourth wall and the axis of rotation of the impeller.

12. The fan system as set forth in claim 11, wherein said first distance is at least 57% of a diameter of the impeller, and said second distance is at least 57% of the diameter of the impeller.

13. The fan system as set forth in claim 8, wherein said second damper plate pivots relative to said fan housing between its opened and closed positions about a second pivot axis that is parallel to said first pivot axis.

14. The fan system as set forth in claim 13, wherein said second backflow prevention damper defines a center of gravity located vertically above said second pivot axis and on an inner side of a second vertical plane that includes said second pivot axis, said inner side of said second vertical plane being oriented toward said chamber.

15. The fan system as set forth in claim 14, wherein:
said second counterweight is connected to second damper plate at a location spaced from an inside face of said second damper plate that is oriented toward said chamber when said second damper plate is located in its closed position.

16. The fan system as set forth in claim 2, wherein said first backflow prevention damper comprises a center of gravity located vertically above said first pivot axis and on an inner side of a first vertical plane that includes said first pivot axis, said inner side of said first vertical plane being oriented toward said chamber.

17. The fan system as set forth in claim 2, wherein:
said first counterweight is connected to first damper plate at a location spaced from an inside face of said first damper plate that is oriented toward said chamber when said first damper plate is located in its closed position.

18. A fan system for an electrical equipment enclosure, said fan system comprising:
a housing defining a chamber;
a first outlet in communication with said chamber and defined by an opening in a first wall of said housing;
a second outlet in communication with said chamber and defined by an opening in a second wall of said housing;
a first backflow prevention damper associated with said first outlet, said first backflow prevention damper comprising: (i) a first damper plate movable relative to said housing between a closed position where it is positioned in covering relation with said first outlet and an opened position where it is moved away from said first outlet to allow exhaust air flow through said first outlet from said chamber; and, (ii) a first counterweight connected to said first damper plate that exerts a closing force on said first damper plate that urges said first damper plate toward its closed position, wherein said first damper plate selectively pivots about a first pivot axis from its closed position toward its opened position against the closing force of the first counterweight in response to exhaust air flow pressure exerted on the first damper plate by exhaust air flowing from said chamber through said first outlet, said first counterweight connected to first damper plate at a location spaced from an inside face of said first damper plate that is oriented toward said chamber when said first damper plate is located in its closed position such that said first backflow prevention damper comprises a center of gravity located vertically above said first pivot axis and on an inner side of a first vertical plane that includes said first pivot axis, said inner side of said first vertical plane being oriented toward said chamber;
a second backflow prevention damper associated with said second outlet, said second backflow prevention damper comprising: (i) a second damper plate movable between a closed position where it is positioned in covering relation with said second outlet and an opened position where it is moved away from said second outlet to allow exhaust air flow through said second outlet from said chamber; and, (ii) a second counterweight connected to said second damper plate that exerts a closing force on said second damper plate that urges said second damper plate toward its closed position, wherein said second damper plate selectively pivots about a second pivot axis that is parallel to said first pivot axis from its closed position toward its opened position against the closing force of the second counterweight in response to exhaust air flow pressure exerted on the second damper plate by exhaust air flowing from said chamber through said second outlet, said second counterweight connected to second damper plate at a location spaced from an inside face of said second damper plate that is oriented toward said chamber when said second damper plate is located in its closed position such that said second backflow prevention damper comprises a center of gravity located vertically above said second pivot axis and on an inner side of a second vertical plane that includes said second pivot axis, said inner side of said second vertical plane being oriented toward said chamber;

said first counterweight comprising a first ballast connected to said first damper plate and located below said first pivot axis when said first damper plate is located in its closed position;

said second counterweight comprising a second ballast connected to said second damper plate and located below said second pivot axis when said second damper plate is located in its closed position.

19. The fan system as set forth in claim 18, wherein both said first and second damper plates pivot between their respective opened and closed positions without spring biasing.

20. A fan system comprising:
a housing defining a fan chamber;
a first outlet from said fan chamber;
a second outlet from said fan chamber;
first and second backflow prevention dampers respectively associated with said first and second outlets;
said first and second backflow prevention dampers each comprising: (i) a damper plate that pivots about a respective pivot axis between a closed position where it is positioned in covering relation with said respective outlet and an opened position where it is pivoted away from said respective outlet; and (ii) a counterweight connected to said respective damper plate and exerting a closing force on said damper plate that urges said damper plate toward its closed position;
wherein said counterweight of each of said first and second backflow prevention dampers comprises
a ballast connected to
said respective damper plate, said ballast located inside said fan chamber when said respective damper plate is located in both its opened and closed positions.

* * * * *